US009916899B2

(12) United States Patent
McVay et al.

(10) Patent No.: US 9,916,899 B2
(45) Date of Patent: Mar. 13, 2018

(54) STORING INFORMATION AND UPDATING MANAGEMENT DATA IN NON-VOLATILE MEMORY

(71) Applicant: Micron Technology, Inc., Boise, ID (US)

(72) Inventors: Jeffrey McVay, El Dorado Hills, CA (US); Daniel Dillon, Fair Oaks, CA (US); Laine Walker-Avina, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 14/841,277

(22) Filed: Aug. 31, 2015

(65) Prior Publication Data

US 2017/0062053 A1 Mar. 2, 2017

(51) Int. Cl.

| | |
|---|---|
| ***G06F 12/00*** | (2006.01) |
| ***G11C 16/08*** | (2006.01) |
| ***G11C 11/56*** | (2006.01) |
| ***G11C 16/10*** | (2006.01) |
| ***G11C 16/22*** | (2006.01) |

(52) U.S. Cl.

CPC .......... *G11C 16/08* (2013.01); *G11C 11/5628* (2013.01); *G11C 16/10* (2013.01); *G11C 16/22* (2013.01)

(58) Field of Classification Search

CPC ......... G11C 16/08; G11C 11/56; G11C 16/10; G11C 16/22

USPC ........................................................ 711/103

See application file for complete search history.

(56) References Cited

U.S. PATENT DOCUMENTS

| | | | | |
|---|---|---|---|---|
| 7,872,915 | B2 * | 1/2011 | Youn | G11C 16/24 365/185.12 |
| 8,732,388 | B2 * | 5/2014 | Chen | G06F 12/0246 711/103 |
| 8,990,458 | B2 * | 3/2015 | Yano | G06F 12/0246 710/18 |
| 2013/0132652 | A1 * | 5/2013 | Wood | G06F 12/0246 711/103 |
| 2013/0322169 | A1 * | 12/2013 | Goss | G11C 16/22 365/185.02 |
| 2015/0347229 | A1 * | 12/2015 | Higgins | G11C 16/10 714/764 |

* cited by examiner

*Primary Examiner* — Pierre-Michel Bataille

(74) *Attorney, Agent, or Firm* — Schwegman Lundberg & Woessner, P.A.

(57) ABSTRACT

Some embodiments include apparatuses and methods having memory cells and a control unit. The control unit can retrieve information from a first portion of the memory cells. The information can include bits organized into a first bit group and second bit group. The information can be associated with management information. The control unit can store the first and second bits in the second group in a second portion of the memory cells. The control unit can update the first and second management information after the second bit group is stored.

17 Claims, 9 Drawing Sheets

220
BIT GROUP
LOGIC ADDR
221
LA1
222
LA2
231
232
150
PHYS ADDR
PA1
PA2
241
242
PA3
PA4
111
MEMORY CELL PORTION
111a
110
CELL
B1
B2
B3
B4
B5
B6
B7
B8
112
112a
T0
T1
T2
T3
T4
T5
T6
TIME

STORING INFORMATION AND UPDATING MANAGEMENT DATA IN NON-VOLATILE MEMORY

BACKGROUND

Many electronic systems, such as desktop and laptop computers, servers, and other electronic devices or systems, have a memory device to store information (e.g., data). Some memory devices have memory cells (e.g., multi-level cells) where each of the memory cells can store multiple bits of information. Many conventional techniques are available to prevent corruption of such information when the memory device performs operations (e.g., internal management operations) on the information. Some of these conventional techniques, however, may include complex circuitry and control that may be unsuitable for some memory devices or systems.

DETAILED DESCRIPTION

Figure 1:
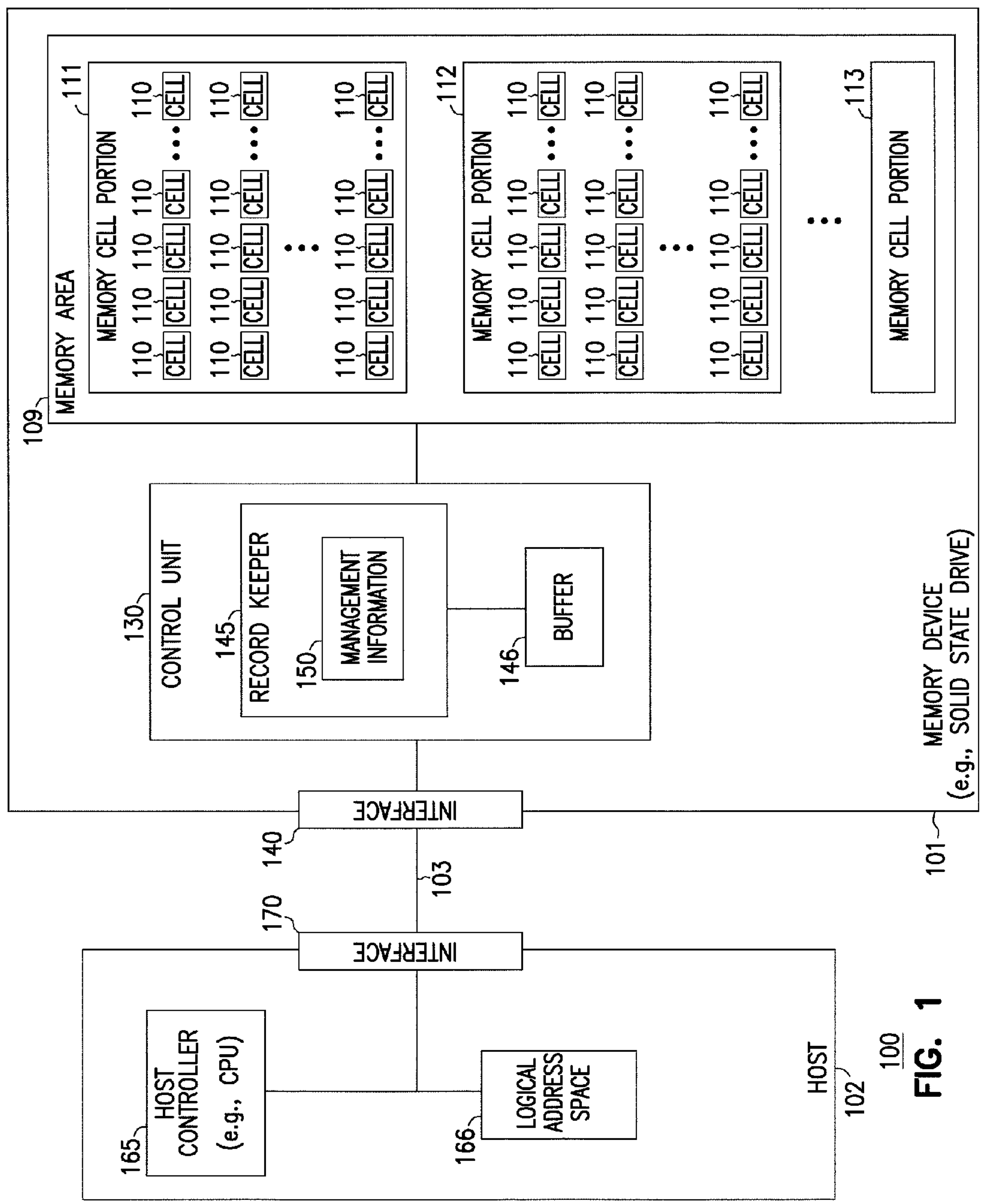
FIG. 1 is a block diagram of an apparatus including a memory device, a host, and a connection, according to some embodiments described herein.

FIG. 1 is a block diagram of an apparatus 100 including a memory device 101, a host 102, and a connection 103, according to some embodiments described herein. Apparatus 100 can include or be included in a computer, a memory storage system, or other types of electronic systems.

As shown in FIG. 1, memory device 101 can include a memory area (e.g., one or more memory cell array) 109, a control unit 130, and an interface 140. Memory area 109 can include memory cells 110 that can be arranged in portions (e.g., memory cell portions) 111, 112, and 113. Each of portions 111, 112, and 113 can include the same or different number (quantity) of memory cells among memory cells 110. Each of portions 111, 112, and 113 can include or be included in a memory cell block (e.g., physical memory block) of memory area 109. For example, portion 111 can include or be included in a block of memory cells 1110 in memory area 109. Portion 112 can include or be included in another block of memory cells 110 in memory area 109. The different block of memory cells 110 that include portions 111 and 112 can be located in the same die or in different dice. FIG. 1 shows three portions 111, 112, and 113 in memory area 109 as an example. The number of portions (e.g., blocks) in memory area 109 can vary.

Memory cells 110 can be included in (e.g., formed in or formed on) a single die or multiple dice. The die can be included in a chip (e.g., a semiconductor chip). Memory cells 110 can include non-volatile memory cells. Examples of non-volatile memory cells include flash memory cells or other types of non-volatile memory cells. Memory cells 110 can be arranged in a NAND-type (e.g., NAND flash) memory arrangement. Although not shown in FIG. 1, memory area 109 also include access lines (e.g., word lines) and data lines (e.g., bit lines) associated with memory cells. Memory device 101 may use access lines to access memory cells 110 during an operation (e.g., read operation) of retrieving information from memory cells 110 or during an operation (e.g., write operation) of storing information in memory cells 110.

Control unit 130 can be included in a die separated from the die (or dice) where memory cells 110 are included. Alternatively, part of control unit 130 or the entire control unit 130 can be included in (e.g., in the same die with) memory cells 110. Memory device 101 can include a solid state drive (SSD). Thus, memory cells 110, control unit 130, and interface 140 can be part of an SSD. One of ordinary skill in the art may recognize that a memory device (e.g., an SSD) such as memory device 101 may include other elements, several of which are not shown in FIG. 1 so as not to obscure the example embodiments described herein.

Each of memory cells 110 can store (e.g., hold) only one bit of information or multiple bits (at least two bits) of information. For example, each of memory cells 110 can be configured as a single-level cell (SLC) to store only one bit of information, multi-level cell (MLC) to store up to two bits of information, triple-level cell (TLC) to store up to three bits of information, Quad-level cell (QLC) to store up to four bits of information, or other configurations to store more than four bits.

In the MLC (2-bit per cell) configuration example, each of memory cells 110 can concurrently store two bits, in which the stored two bits can have a value (e.g., binary value) corresponding to one of four possible combinations of two binary bits (e.g., one of "00", "01", 10", and "11").

In the TLC (3-bit per cell) configuration example, each of memory cells 110 can concurrently store three bits, in which the stored three bits can have a value (e.g., binary value) corresponding to one of eight possible combinations of two binary numbers (e.g., one of "000", "001", 010", "011", "100", "101", "110", and "111".

In the QLC (4-bit per cell) configuration example, each of memory cells 110 can concurrently store four bits, in which the stored four bits can have a value (e.g., binary value) corresponding to one of eight possible combinations of two binary numbers (e.g., one of "0000", "0001", 0010", "0011", "0100", "0101", "0110", "0111", "1000", "1001", "1010", "1011", "1100", "1101", "1110", and "1111".

As shown in FIG. 1, host 102 can include a host controller 165 and an interface (e.g., host interface) 170. Host controller 165 can include a central processing unit (CPU) that can perform operations such as processing information (e.g., data) used in apparatus 100. Host 102 may use host controller 165 to communicate with memory device 101 to store information in memory device 101. One of ordinary skill in the art may recognize that a host in a system (e.g., computer system, memory storage system, or other systems) such as host 102 may include other elements, several of which are not shown in FIG. 1, so as not to obscure the example embodiments described herein. Host 102 and memory device 101 can communicate (e.g., exchange information) with each other through connection 103.

Connection 103 can include conductive traces (e.g., a bus) on a circuit board (e.g., motherboard), a wire cable, or a combination of both, to allow communion between memory device 101 and host 102 through interfaces 140 and 170. Each of interfaces 140 and 170 can include components (e.g., connectors and circuitry) that comply with Peripheral Component Interconnect Express (PCIe) specification, Serial Advanced Technology Attachment (SATA) specification, Serial Attached Small Computer System Interface (SAS) specification, or other specifications. Thus, each of interfaces 140 and 170 may include a connector having a form factor (e.g., physical dimension and conductive terminals) complying with PCIe, SATA, SAS, or other specifications.

As shown in FIG. 1, host 102 can include a logical address space 166. Host 102 can store information at logical addresses (e.g., logical locations) in logical address space 166. Host 102 may be associated with (e.g., or may include) an operating system (OS) that may also recognize logical address space 166 used by host 102. Logical addresses in logical address space 166 can be linked (e.g., mapped) to corresponding physical addresses (e.g., a physical location) where information (e.g., host data) used by host 102 is actually (e.g., physically) stored. For example, as described in more detail below, a particular logical address in logical address space 166 can be linked to a particular physical address in memory cells 110 of memory device 101 where information can be stored in a particular portion of memory cells 110 associated with that particular physical address.

Memory device 101 can store information (e.g., host data) in different portions 111, 112, and 113. Each of memory cells 110 has a unique physical address. The location of each of memory cells 110 can be identified (e.g., located) by its physical address. A particular portion among portions 111, 112, and 113 can be identified by a physical address associated with that particular portion. Thus, information stored in a particular location (e.g., location of a group of memory cells among memory cells 110) in a particular portion (e.g., one of portions 111, 112, and 113) can be located by the physical address associated with that particular location and particular portion.

Control unit 130 may exchange information with host 102 in chunks (e.g., a number of bits of information) associated with logical addresses recognized by control unit 130 and host 102. Logical addresses (e.g., logical addresses in logical address space 166) known to host 102 and control unit 130 may be different from the physical addresses of memory cells of portions 111, 112, and 113. For example, as described above, host 102 may store information (e.g., host data) in logical address space 166 and access the information based on logical addresses in logical address space 166. Control unit 130, however, may store information (e.g., host data) in memory cells 110, which are physical locations. Control unit 130 can access stored information based on physical addresses of memory cells 110. The locations (e.g., portions 111, 112, and 113) of memory cells 110 where control unit 130 stores information may be unknown to host 102.

As shown FIG. 1, control unit 130 can include a record keeper 145, which can store management information 150, and a buffer 146. In some arrangements, record keeper 145, buffer 146, or both can include a flash translation layer (FTL) or can be part of such an FTL. At least a portion of control unit 130 (e.g., a portion or the entirety of control unit 130) can be implemented by software, firmware, hardware, or any combination of software, firmware, and hardware. Thus, record keeper 145, buffer 146, or both can also be implemented by software, firmware, hardware, or any combination of software, firmware, and hardware.

Buffer 146 can operate to store (e.g., temporarily) information that control unit 130 may use during operations (e.g., read and write operations) in memory device 101. For example, during an operation of storing information (e.g., host data), control unit 130 may temporarily store updating information (e.g., metadata) for updating the content of management information 150. Then, at or near the end of such operation, control unit 130 may update management information 150 based on the updating information in buffer 146.

Management information 150 in record keeper 145 can include management data (e.g., metadata) and other information that allows control unit 130 to manage (e.g., retrieve, store, and track) information (e.g., host data and other information) in memory device 101. The management data (e.g., metadata) in management information 150 can include data to keep track of the locations in memory cells 110 (e.g., locations in portions 111, 112, and 113) where information is stored. For example, the management data can include links (e.g., a mapping) between logical addresses associated with information (e.g., host data used by host 102) and physical addresses (e.g., address of portions 111, 112, and 113) where the information is stored. The logical addresses in the management data may be based on logical addresses in logical address space 166 of host 102. The links contained in the management data may allow control unit 130 access particular memory cells 110 in a particular portion having physical addresses linked (e.g., mapped) to the logical address (e.g., that may be provided by or based on a logical address from host 102). This may allow control unit 130 to retrieve information (associated with the logical addresses) from particular memory cells 110 or store information (associated with the logical addresses) in the particular memory cells 110. Besides the links between logical addresses and physical addresses, the management data (e.g., metadata) in management information 150 can also include additional data associated with portions (e.g., portions 111, 112, and 113) in memory device 101 to allow control unit 130 to manage information and perform maintenance operations in memory device 101.

In some situations, control unit 130 may move or may copy information from one portion in memory area 109 to another portion in memory area 109. For example, control unit 130 may perform a consolidation operation (e.g., a garbage collection operation) to consolidate information to improve (e.g., increase) storage capacity in memory area 109 at a particular time. In a consolidation operation, control unit 130 may retrieve (e.g., read) information (e.g., valid information) that may be scattered in many portions (e.g., portions 111, 112, and 113) in memory area 109. Then, control unit 130 may store the retrieved information (e.g., scattered information) in fewer portions. Control unit 130 may clear (e.g., erase) information from a portion (or portions) in memory area 109 where scattered information was stored. This may increase available storage space in memory area 109 to store new information.

Control unit 130 may move or may copy information from one portion of memory area 109 to another in memory area 109 in other operations besides the consolidation operation described above. For example, control unit 130 may use some of portions 111, 112, and 113 in memory area 109 as cache memory in which control unit 130 may copy information from one portion of memory area 109 to another portion in memory area 109 as part of a cache operation. The techniques described herein may also be applicable to other memory operations where information already stored in a portion of a memory device is retrieved and then the retrieved information is stored in another portion of the memory device.

Control unit 130 may update (e.g., change the content of) management information 150 each time information is stored (e.g., in a write operation) in memory area 109. Control unit 130 may also update (e.g., change the content of) management information 150 each time information already stored in one portion of memory area 109 is moved or copied (e.g., in a consolidation operation or a cache operation) to another portion of memory area 109. Updating management information 150 allows control unit 130 to track the locations (e.g., locations of portions, e.g., portions 111, 112, and 113) in memory area 109 where information associated with a particular logical address is stored.

Figure 2:
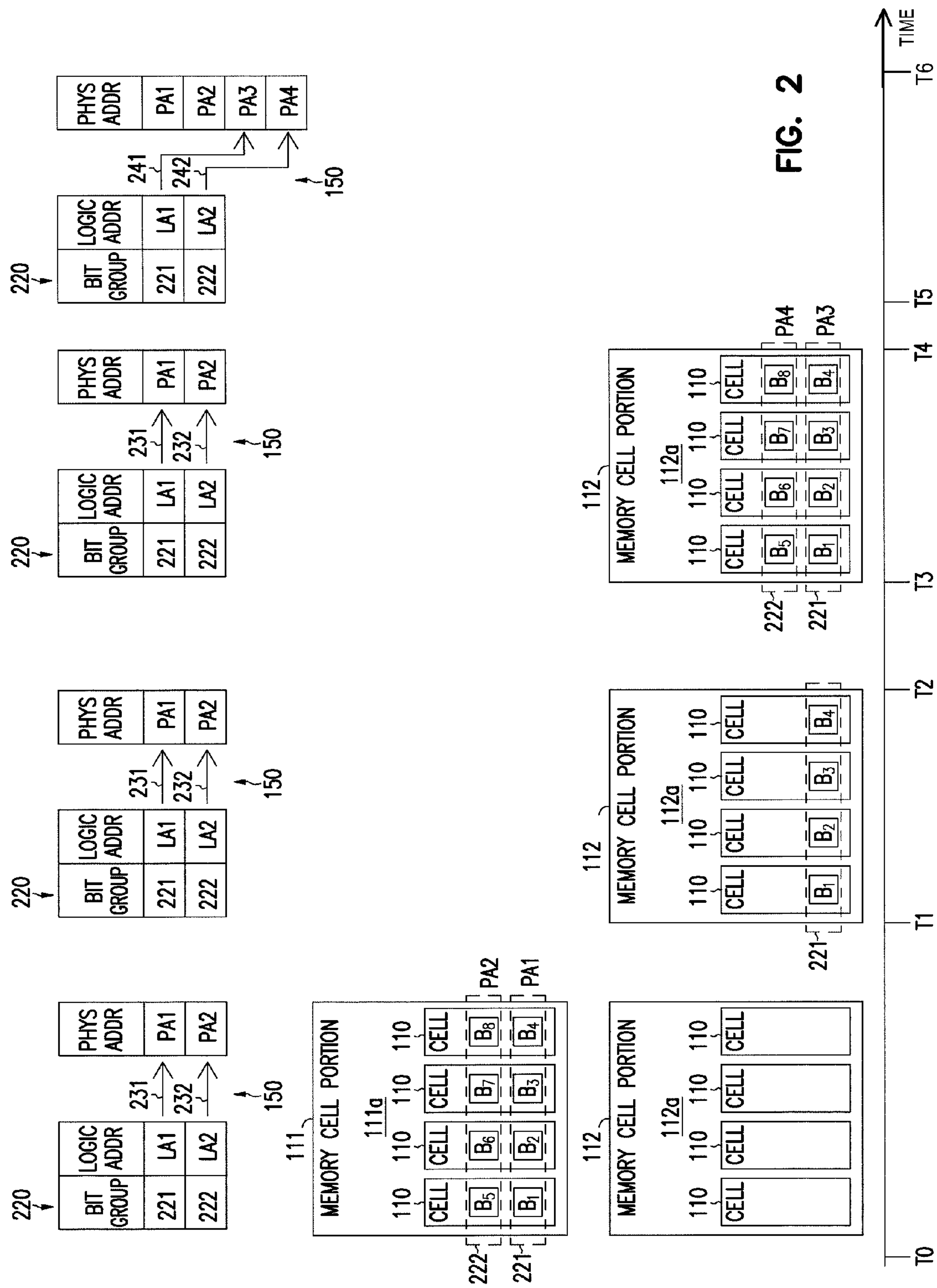
FIG. 2 shows example operations of managing information in the memory device of FIG. 1 where each of the memory cells in the memory device is assumed to be configured as a 2-bit per cell configuration, according to some embodiments described herein.

FIG. 2 shows example operations of managing information in memory device 101 of FIG. 1, according to some embodiments described herein. The operations associated with FIG. 2 include retrieving information 220 from portion 111, storing information 220 in portion 112 after it is retrieved from portion 111, and updating management information 150 associated with portion 112 after information 220 is stored in portion 112. Control unit 130 may clear (e.g., erase) information 220 from portion 111 (e.g., a part of a consolidation operation or cache operation as mentioned above) after management information 150 is updated.

As shown in FIG. 2, portion 111 can include a memory cell group 111*a* (e.g., a group of memory cells 110 in portion 111) that can include four memory cells 110. Memory cell group 111*a* already has information 220 stored therein. For example, before time T0, control unit 130 (FIG. 1) may perform a write operation to store bits $B_1$, $B_2$, $B_3$, $B_4$, $B_5$, $B_6$, $B_7$, and $B_8$ of information 220 in memory cell group 111*a*.

The example in FIG. 2 assumes that each of memory cells 110 in memory device 101 is configured as an MLC (2-bit per cell). Thus, each of memory cells 110 in memory cell group 111*a* can store two bits among bits $B_1$ through $B_8$, such as bits $B_1$ and $B_5$, bits $B_2$ and $B_6$, bits $B_3$ and $B_7$, or bits $B_4$ and $B_8$.

As shown in FIG. 2, bits $B_1$ through $B_8$ can be organized into two groups of bits (bit groups), such as a bit group 221 and a bit group 222. Bit group 221 can include four bits: $B_1$, $B_2$, $B_3$, and $B_4$. Bit group 222 can include four bits: $B_5$, $B_6$, $B_7$, and $B_8$. FIG. 2 shows memory cell group 111*a* including four memory cells 110 as an example. In reality, the number of memory cells in group 111*a* can be different (e.g., thousands of memory cells). Thus, each of bit groups 221 and 222 can include a number of bits (e.g., thousands of bits) different from the example of four bits in FIG. 2.

Bit group 221 can be included in a page of information 220. Bit group 222 can be included in another page of information 220. One skilled in the art would recognize that information (e.g., data) can be stored in memory cells (e.g., memory cells 110) in pages (e.g., a lower page and an upper page). Each of such pages can include a group of bits. For multiple-level memory cells (e.g., memory cells in MLC, TLC, and QLC configurations), the same group of memory cells can store multiple pages (e.g., lower and upper pages), such that each of the multiple-level memory cells in the group can store multiple bits (e.g., two, three, or four bits), one bit from each of the multiple pages.

In FIG. 2, for example, bit group 221 (that includes bits $B_1$, $B_2$, $B_3$, and $B_4$) can be included in (e.g., part of) one page (e.g., a lower page) of information 220. Bit group 222 (that includes bits $B_5$, $B_6$, $B_7$, and $B_8$) can be included in (e.g., part of) another page (e.g., upper page) of information 220. Control unit 130 can store bit groups 221 and 222 in memory cells 110 of memory cell group 111*a* at different times. For example, during a time interval before time T0 in FIG. 2, control unit 130 may store bit group 221 in memory cell group 111*a*. Then, during another time interval before time T0 in FIG. 2 (after bit group 222 is stored), control unit 130 may store bit group 222 in memory cell group 111*a*. Since each of memory cells 110 in memory device 101 in the example of FIG. 2 is assumed to be configured as an MLC (2-bit per cell), memory cell group 111*a* in FIG. 2 is also assumed to store up to a maximum of two pages of information (e.g., a maximum number of two bit groups, such as bit groups 221 and 222).

Moreover, since bit groups 221 and 222 stored in memory cell group 111*a* can be included in different pages of information 220, the multiple bits stored in each of memory cells 110 in memory cell group 111*a* can be included in different pages. For example, bit $B_1$ can be included in (e.g., part of) one page (e.g., a lower page that includes bit group 221) and bit $B_5$ can be included in (e.g., part of) another page (e.g., a upper page that includes bit group 222). In another example, bit $B_2$ can be included in (e.g., part of) one page (e.g., a lower page that includes bit group 221) and bit $B_6$ can be included in (e.g., part of) another page (e.g., an upper page that includes bit group 222).

After information 220 is stored in portion 111 (before time T0), control unit 130 may generate (or update) particular management information (e.g., metadata) in management information 150 associated with information 220. As described above, management information 150 in can include logical addresses that are linked to corresponding physical addresses. FIG. 2 shows part of management information 150 between times T0 and T1 after information 220 is stored in portion 111.

As shown in FIG. 2, between times T0 and T1, management information 150 can include management data (e.g., metadata) associated with information 220 stored in portion 111. The management data can include logical addresses LA1 and LA2 linked to physical addresses PA1 and PA2, respectively, by links 231 and 232. Logical addresses LA1 and LA2 may be based on logical addresses in logical address space 166 of host 102 (FIG. 1). Physical addresses PA1 and PA2 can be associated with locations of particular memory cells 110 in portion 111 where information 220 associated with logical addresses LA1 and LA2, respectively, are stored.

At some point in time (e.g., before time T1), control unit 130 may retrieve information 220 and then store it (e.g., between times T1 and T4) in another portion of memory area 109, such as in memory cell group 112*a* (e.g., a group of memory cells 110 in portion 112) in portion 112.

Before time T1, memory cells 110 in memory cell group 112*a* in portion 112 may be empty (e.g., in an erased state). FIG. 2 shows memory cell group 112*a* including four memory cells 110 as an example. In reality, the number of memory cells in memory cell group 112*a* can be different (e.g., thousands of memory cells). As assumed above, each of memory cells 110 is configured as an MLC (2-bit per cell). Thus, memory cell group 112*a* in FIG. 2 is assumed to store up to a maximum of two pages of information (e.g., information 220), such as a maximum number of two bit groups (e.g., bit groups 221 and 222 from portion 111).

Between times T1 and T2 (which is after time T0), control unit 130 may store bit group 221 (e.g., bits $B_1$, $B_2$, $B_3$, and $B_4$) in memory cells 110 in memory cell group 112*a* in portion 112.

Between times T3 and T4 (e.g., after time T2), control unit 130 may store bit group 222 (e.g., bits $B_5$, $B_6$, $B_7$, and $B_8$) in memory cells 110 in memory cell group 112*a* in portion 112.

Between times T1 and T4, the content of management information 150 may remain unchanged. For example, between times T1 and T4, links 231 and 232 may remain unchanged (e.g., may not be updated), such that logical addresses LA1 and LA2 may still be linked to physical addresses PA1 and PA2, respectively, in portion 111.

Control unit 130 may update management information 150 between times T5 and T6 (e.g., after time T4) after control unit 130 determines that information 220 (e.g., the value of bit groups 221 and 222) stored in memory cell group 112*a* is stable (e.g., valid). For example, control unit 130 may update the metadata in management information 150, such that links 231 and 232 (before time TT5) become links 241 and 242, respectively (after time T5).

As described above, between times T0 and T1, logical addresses LA1 and LA2 associated with information 220 are linked to physical addresses PA1 and PA2, respectively, in portion 111, where information 220 is stored. After management information 150 is updated (e.g., between times T5 and T6), logical addresses LA1 and LA2 associated with information 220 are linked to physical addresses PA3 and PA4, respectively, in portion 112, where information 220 is stored.

Updating management information 150 after information 220 is stored in portion 112 allows control unit 130 to correctly identify the locations (e.g., current locations) of particular memory cells (e.g., in portion 112) that store information 220 associated with logical addresses LA1 and LA2 at any time (e.g., after time T6).

In the example operations described above, control unit 130 may update management information 150 between times T5 and T6, which is after (e.g., after time T4) both bit groups 221 and 222 (e.g., both pages) of information 220 are stored in portion 112. For example, after time T4, control unit 130 may update link 231 (e.g., change link 231 to link 241) associated with bit group 221, and update link 232 (e.g., change link 232 to link 242) associated with bit group 222.

The example above shows that control unit 130 may update management information 150 only after a maximum number of pages of information 220 are stored in portion 112. For example, since memory cell group 112*a* in FIG. 2 is assumed to store up to a maximum of two pages (e.g., bit groups 221 and 222) of information (e.g., information 220), the example in FIG. 2 shows that control unit 130 may update management information 150 only after a maximum number of pages (e.g., pages that include bit groups 221 and 222) are stored in memory cell group 112*a* in a portion 112 in FIG. 2.

As shown in FIG. 2, control unit 130 may abstain from updating management information 150 between times T2 and T3. This means that control unit 130 may abstain from updating (e.g., may not update) management information 150 (e.g., metadata) associated with bit group 221 between times T2 and T3. As described above, bit group 221 can be associated with logical address LA1 that can be linked to physical address PA1 by link 231. Thus, in the example of FIG. 2, although bit group 221 is stored in memory cell group 112*a* between times T1 and T2, control unit 130 may delay updating link 231 (e.g., delay changing link 231 to link 241) until after time T4, which is after bit group 222 is stored in memory cell group 112*a*.

In the example of FIG. 2, control unit 130 may store (e.g., temporarily) management data (e.g., metadata) associated with at least part of management information 150 before the management data is updated. For example, after storing bit group 221 between times T1 and T2 in memory cell group 112*a* of portion 112, control unit 130 may generate link 241 (e.g., the metadata associated with bit group 221) that link logical address LA1 to physical address PA3 and store link 241 in buffer 146. In this example, control unit 130 may store link 241 in buffer 146 between times T2 and T4. Control unit 130 may delay updating link 231 to link 241 in management information 150 until after time T4. In another example, after storing bit group 222 between times T3 and T4 in memory cell group 112*a* of portion 112, control unit 130 may generate 242 (e.g., the metadata associated with bit group 222) that links logical address LA2 to physical address PA4 and store link 241 in buffer 146. In this example, control unit 130 may store link 242 in buffer 146 between times T4 and T5. Control unit 130 may delay updating link 232 to link 242 in management information 150 until after time T4. After both bit groups 221 and 222 are stored in portion 112, control unit 130 may access buffer 146 (e.g., after time T4) in order to update management information 150 based on links 232 and 242 in buffer 146.

FIG. 2 shows an example wherein bit groups 221 and 222 (which are to be stored in portion 112) are retrieved between times T0 and T1 from the same memory cells 110 in the same memory group (e.g., 111*a*). However, bit groups 221 and 222 may be retrieved from different memory cell groups.

Storing information 220 and updating management information 150 as described above may prevent corruption of information store in memory device 101. This may improve the reliability of memory device 101 in comparison to some conventional memory devices. For example, after bit group 221 is stored in portion 112 (and before group bits 222 is stored) and the value of bit group 221 is determined to be stable (e.g., between times T1 and T2), some events may cause the value of bit group 221 to be unstable or corrupted at a later time (e.g., between times T3 and T4). Further, some other events may affect memory cell group 112*a* or elements associated with memory cell group 112*a*, such that storing bit group 221 in memory cell group 112*a* may be unsuccessful that may also lead to corrupted information.

Examples of the events mentioned above may include an operation of storing bit group 222 in memory cell group 112*a* in portion 112 (that operation may disturb bit group 221 (e.g., disturb the values of bits bit group 221) that was already stored in memory cell group 112*a*), and power interruption (e.g., power loss) that may occur between times T3 and T4 while bit group 222 is stored in portion 112. Other examples of the events mentioned above may include word lines shorting (e.g., word line associated with memory cell group 112*a* may be shorted (e.g., electrically connected) to one or more adjacent word line), and cross capacitance dependencies (e.g., the capacitance associated with memory cell group 112*a* may be influenced by the capacitance of adjacent memory cells).

In the operations associated with FIG. 2, if control unit 130 does not delaying the update of link 231 (as described above) but changes link 231 to link 241 before bit group 222 is stored (instead of after bit group 222 is stored as described above), then logical address LA1 in this case would be linked to physical address PA3 before time T3 (before bit group 222 is stored). In this case (e.g., without delaying the update of link 231), if the value of bit group 221 is unstable or corrupted (e.g., that may caused by the events mentioned above), then logical address LA1 is linked physical address PA3, which is associated with memory cell group 112*a* that has unstable or corrupted information stored therein. By delaying the update of link 231 until after bit group 222 is stored (e.g., until after time T4) and until after information 222 is determined to be stable (e.g., valid), corruption of information 220 may be prevented.

Figure 3A:
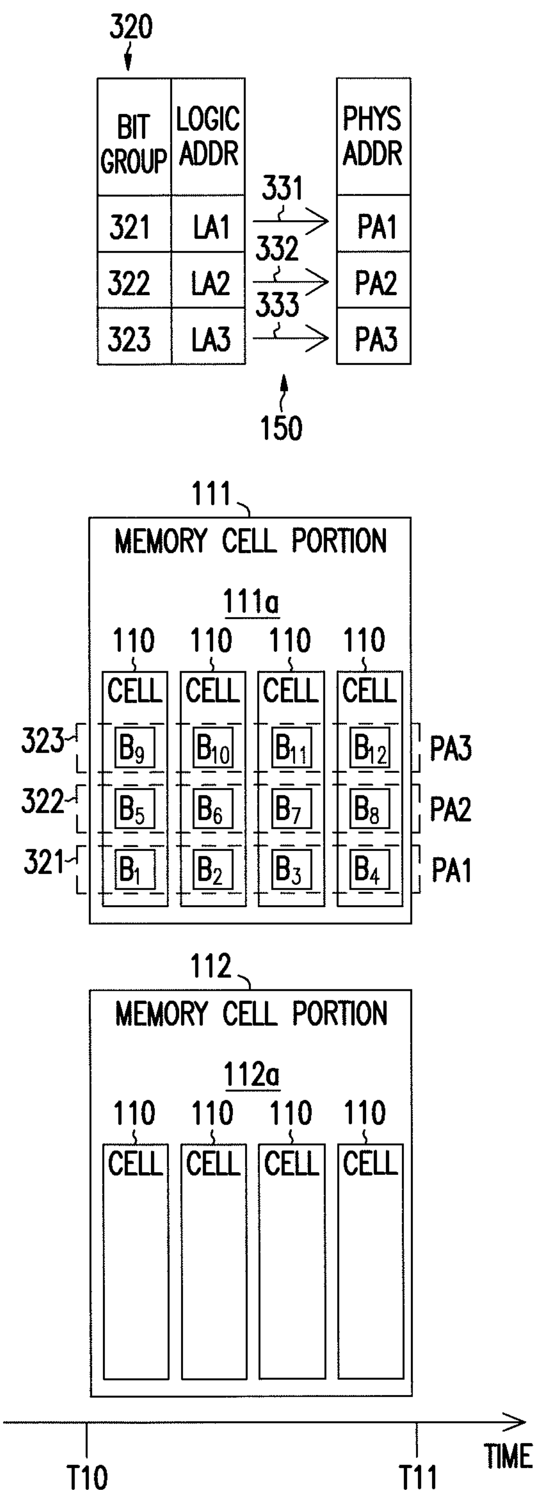
FIG. 3A and FIG. 3B show example operations of managing information in the memory device of FIG. 1 where each of the memory cells in the memory device is assumed to be configured to as a 3-bit per cell configuration, according to some embodiments described herein.
Figure 3B:
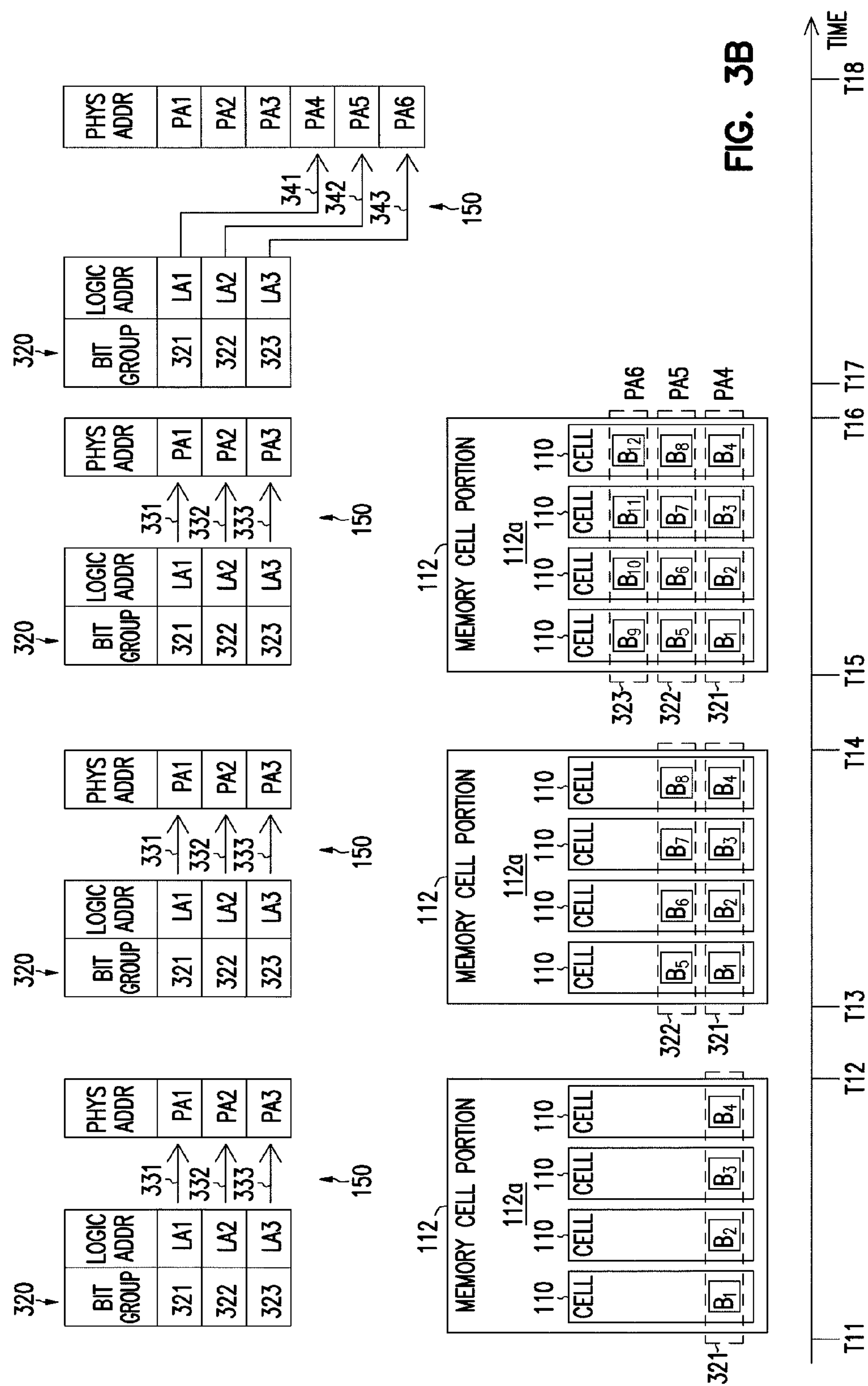

FIG. 3A and FIG. 3B show example operations of managing information in memory device 101 of FIG. 1 where each of memory cells 110 is assumed to be configured as a TLC, according to some embodiments described herein. The operations associated with FIG. 3A and FIG. 3B can be similar to the operations associated with FIG. 2 except that each of memory cells 110 in the example of FIG. 3A and FIG. 3B is assumed to be configured as TLC (3-bit per cell). Thus, in the example of FIG. 3A and FIG. 3B, each of memory cell group 111*a* and 112*a* is assumed to store up to a maximum of three pages (e.g., pages that include bit groups 321, 322, and 323) of information.

As shown in FIG. 3A, portion 111 already has information 320 stored therein. Information 320 can include bits $B_1$ through $B_{12}$ that can be organized into bit groups 321, 322, and 323, which can be part of three pages (e.g., lower, middle, and upper pages) of information 320. Each of bit groups 321, 322, and 323 can include four bits among bits $B_1$ through $B_{12}$ as shown in FIG. 3A.

Control unit 130 can retrieve bit groups 321, 322, and 323 of information 320 from portion 111 and store them in memory cell group 112*a* of portion 112 at different times. For example, as shown in FIG. 3B, control unit 130 can store bit group 321 in portion 112 between times T11 and T12, store bit group 322 in portion 112 between times T13 and T14, and store bit group 323 in portion 112 between times T15 and T16. Between times T11 and T16 the content of management information 150 may remain unchanged. For example, between times T11 and T16, links 331, 332, and 333 may remain unchanged (e.g., may not be updated), such that logical addresses LA1, LA2, and LA3 may still be linked to physical addresses PA1, PA2, and PA3, respectively, in portion 111. Control unit 130 may update management information 150 between times T17 and T18 (e.g., after time T16) after control unit 130 determines that information 320 (e.g., the value of bit groups 321, 322, and 323) stored in memory cell group 112*a* is stable (e.g., valid). For example, as shown in FIG. 3B, control unit 130 may update the metadata in management information 150, such that links 331, 332, and 333 (before time T17) become links 341, 342, and 343, respectively (after time T17).

Thus, in the example of FIG. 3A and FIG. 3B, although bit groups 321 and 322 are stored in memory cell group 112*a* between times T11 and T14, control unit 130 may delay updating links 331 and 332 (e.g., delay changing links 331 and 332 to links 341 and 342, respectively) until after time T16, which is after bit groups 321, 322, and 323 are stored in memory cell group 112*a*. Since memory cell group 112*a* in FIG. 3A and FIG. 3B is assumed to store up to a maximum of three pages (e.g., bit groups 321, 322, and 323) of information, the example associated with FIG. 3A and FIG. 3BA shows that control unit 130 may update management information 150 only after a maximum number of pages (e.g., pages that include bit groups 321, 322, and 323) are stored in memory cell group 112*a* in portion 112. Updating management information 150 in the example associated with FIG. 3A and FIG. 3B can also prevent corruption of information as described above with reference to FIG. 2.

Figure 4A:
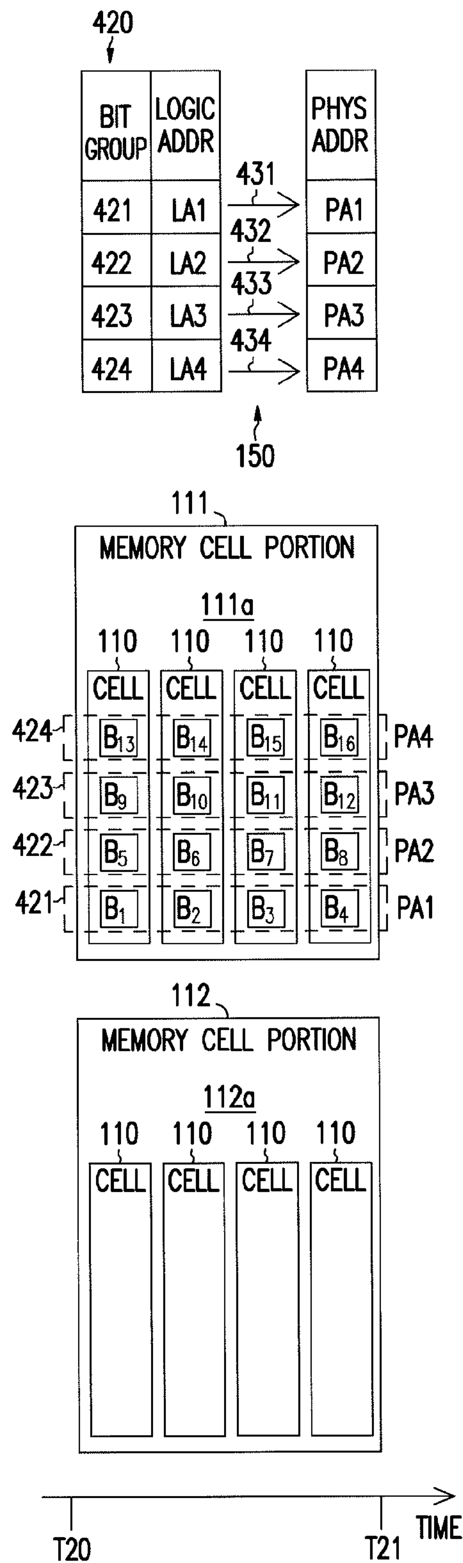
FIG. 4A, FIG. 4B, and FIG. 4C show example operations of managing information in the memory device of FIG. 1 where each of the memory cells in the memory device is assumed to be configured as a 4-bit per cell configuration, according to some embodiments described herein.
Figure 4B:
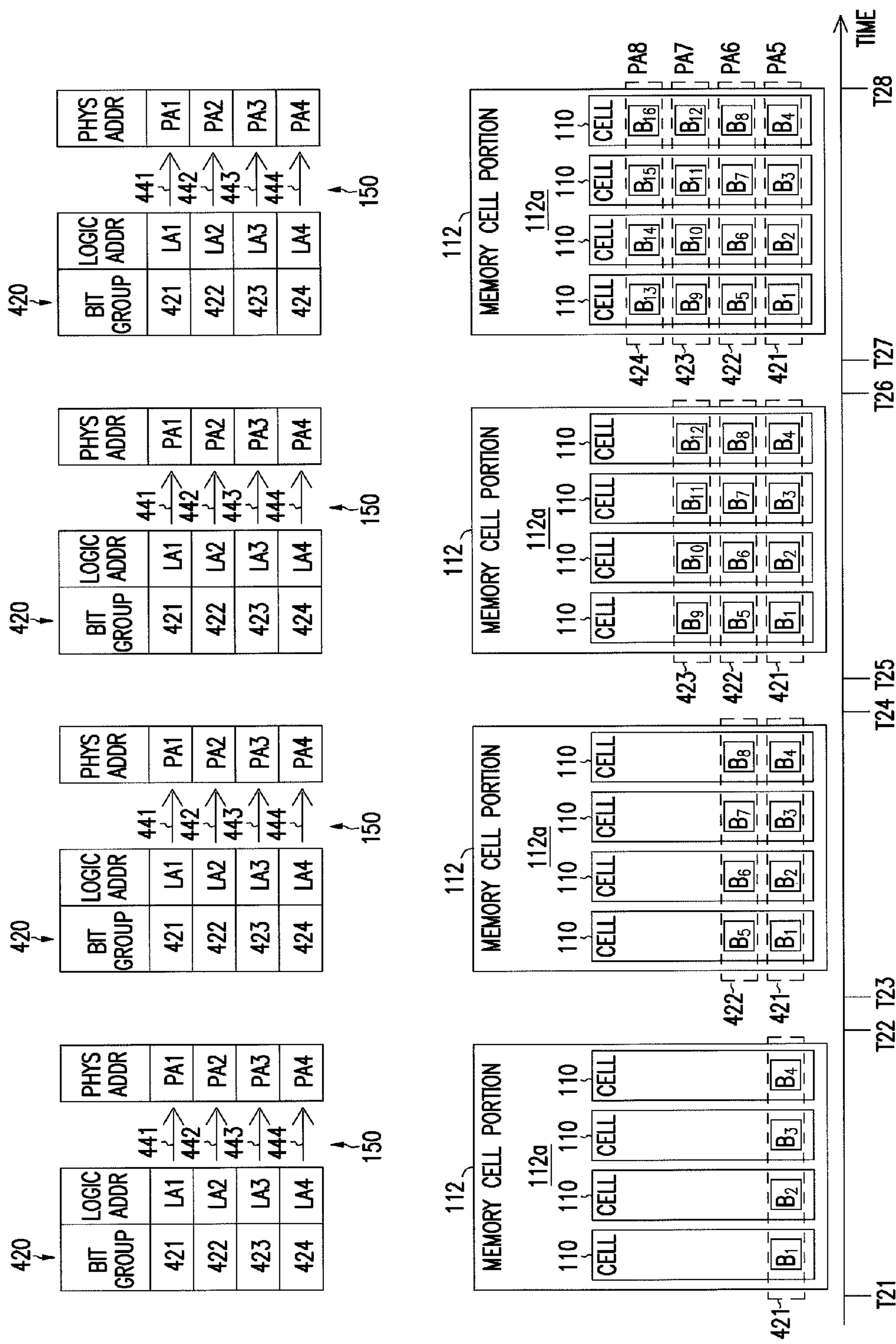
Figure 4C:
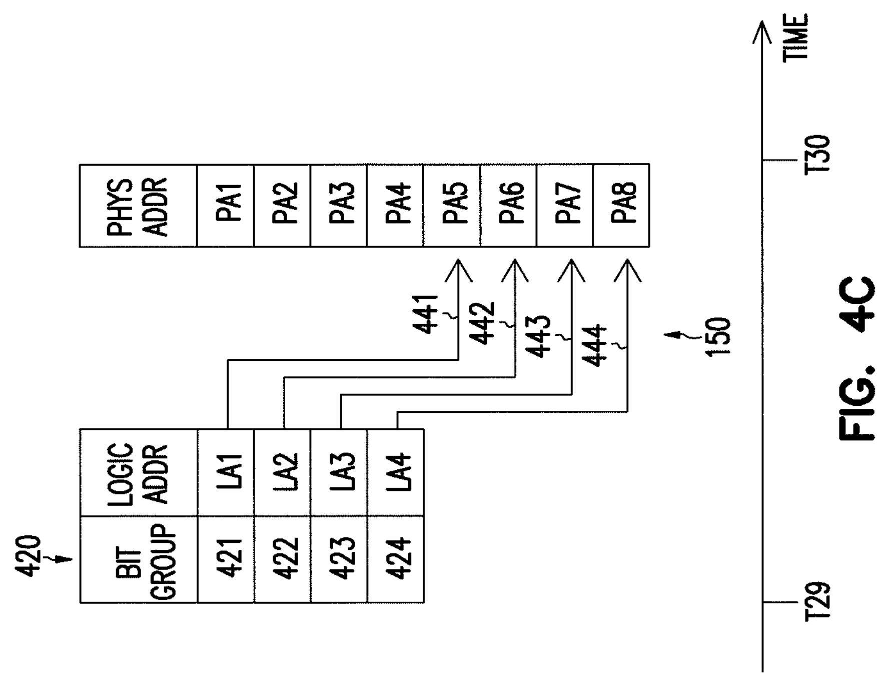

FIG. 4A, FIG. 4B, and FIG. 4C shows example operations of managing information in memory device 101 of FIG. 1 where each of memory cells 110 is assumed to be configured as a QLC, according to some embodiments described herein. The operations associated with FIG. 4 through FIG. 4C can be similar to the operations associated with FIG. 2 except that each of memory cells 110 in the example of FIG. 4 through FIG. 4C is assumed to be configured as QLC (4-bit per cell). Thus, in the example of FIG. 4 through FIG. 4C, each of memory cell group 111*a* and 112*a* is assumed to store up to a maximum of four pages (e.g., pages that include bit groups 421, 422, 423, and 424) of information.

As shown in FIG. 4A, portion 111 already has information 420 stored therein. Information 420 can include bits $B_1$ through $B_{16}$ that can be organized into bit groups 421, 422, 423, and 424, which can be part of four pages (e.g., a lower, two middle pages, and an upper page) of information 420. Each of bit groups 421, 422, 423, and 424 can include four bits among bits $B_1$ through $B_{16}$ as shown in FIG. 4A.

Control unit 130 can retrieve bit groups 421, 422, 423, and 424 of information 320 from portion 111 and store them in memory cell group 112*a* of portion 112 at different times. For example, as shown in FIG. 4B, control unit 130 can store bit group 421 in portion 112 between times T21 and T22, store bit group 422 in portion 112 between times T23 and T24, store bit group 423 in portion 112 between times T25 and T26, and store bit group 424 in portion 112 between times T27 and T28. Between times T21 and T28 the content of management information 150 may remain unchanged. For example, between times T21 and T28, links 431, 432, 433, and 434 may remain unchanged (e.g., may not be updated), such that logical addresses LA1, LA2, LA3, and LA4 may still be linked to physical addresses PA1, PA2, PA3, and PA4, respectively, in portion 111. Control unit 130 may update management information 150 between times T29 and T30 (e.g., after time T28) after control unit 130 determines that information 420 (e.g., the value of bit groups 421, 422, 423, and 424) stored in memory cell group 112*a* is stable (e.g., valid). For example, as shown in FIG. 4C, control unit 130 may update the metadata in management information 150, such that links 431, 432, 433, and 434 (before time T29) become links 441, 442, 443, and 444, respectively (after time T29).

Thus, in the example of FIG. 4, although bit groups 421, 422, and 423 are stored in memory cell group 112*a* between times T21 and T28, control unit 130 may delay updating links 431, 432, and 433 (e.g., delay changing links 431, 432, and 433 to links 441, 442, and 443, respectively) until after time T28, which is after bit groups 421, 422, 423, and 424 are stored in memory cell group 112*a*. Since memory cell group 112*a* in FIG. 4 is assumed to store up to a maximum of four pages (e.g., pages that include bit groups 421, 422, 424, and 424) of information, the example associated with FIG. 4A through FIG. 4C shows that control unit 130 may update management information 150 only after a maximum number of pages (e.g., bit groups 421, 422, 423, and 424) are stored in memory cell group 112*a* in a portion 112. Updating management information 150 in the example associated with FIG. 4 can also prevent corruption of information as described above with reference to FIG. 2.

Figure 5:
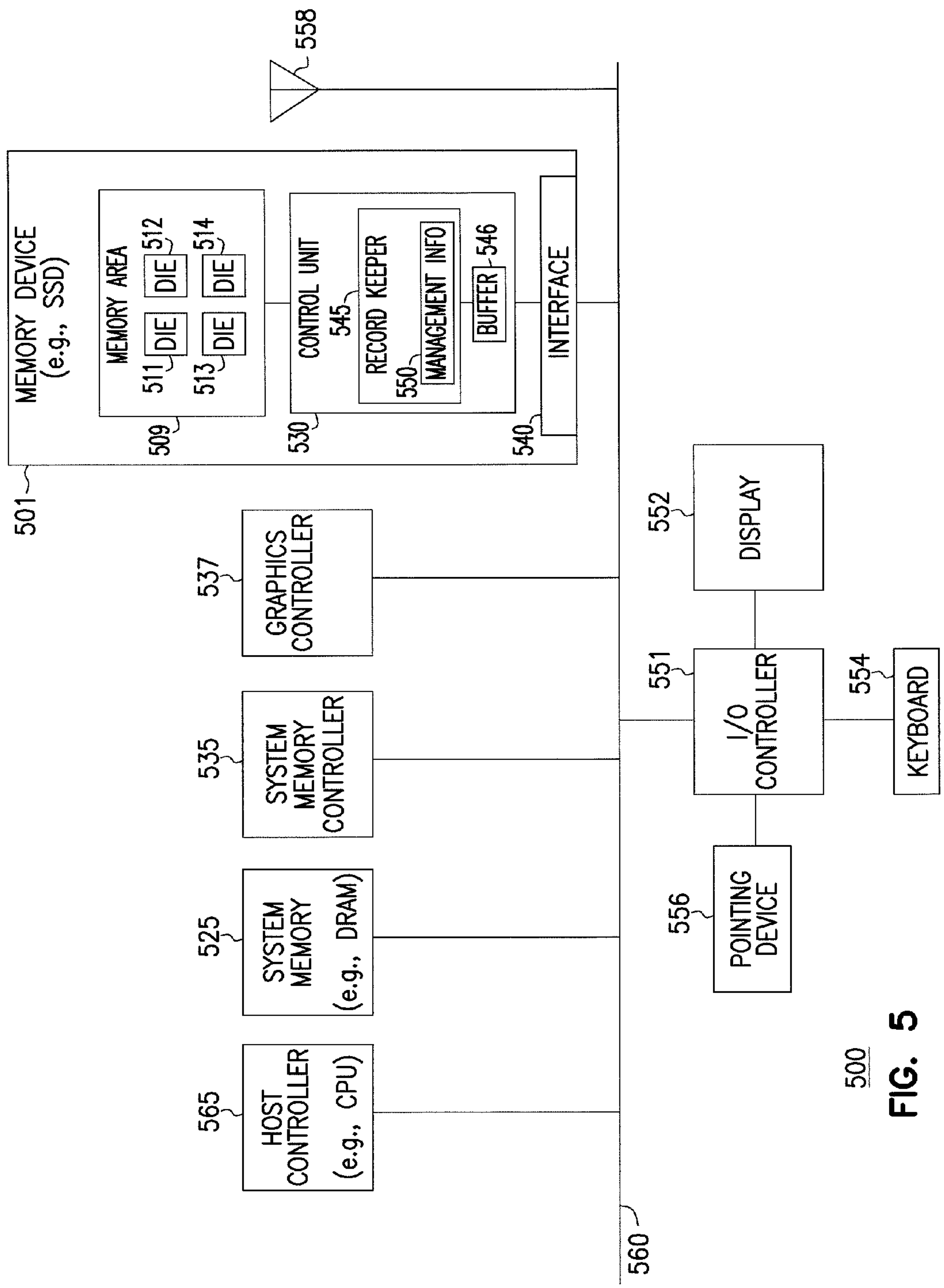
FIG. 5 is a block diagram of an apparatus in the form of a system (e.g., electronic system), according to some embodiments described herein.

FIG. 5 is a block diagram of an apparatus in the form of a system (e.g., electronic system) 500, according to some embodiments described herein. System 500 can include or be included in a computer, a memory storage system, or other types of electronic systems. As shown in FIG. 5, system 500 can include a memory device 501 (which can include an SSD), a host controller 565, a system memory 525, a system memory controller 535, a graphics controller 537, an input and output (I/O) controller 551, a display 552, a keyboard 554, a pointing device 556, at least one antenna 558, and a bus 560. Some of the components of system 500 (e.g., some of the components in FIG. 5, except memory device 501) can include or be included in a host, such as host 102 of FIG. 1.

Memory device 501 can correspond to memory device 101 of FIG. 1. For example, memory device 501 can include a memory area 509 that can correspond to memory area 109 of FIG. 1. Memory area 509 can include memory cells (not shown) that can be similar to, or the same as, memory cells 110 of memory device 501. As shown in FIG. 5, memory area 509 can include dice (e.g., semiconductor chips) 511, 512, 513, and 514 where the memory cells of memory area 509 can be located (e.g., formed in or formed on). Memory area 509 can include memory cell portions (such as portions 111, 112, and 113 in FIG. 1). Such memory cell portions in memory area 509 can be included in only one die among dice 511, 512, 513, and 514 or included in multiple dice among dice 511, 512, 513, and 514. FIG. 5 shows memory device 501 including four dice 511, 512, 513, and 514 as an example. The number of dice in memory device 501 may vary.

Memory device 501 can also include a control unit 530 and an interface 540, which can correspond to control unit 130 and interface 140, respectively, of memory device 101 of FIG. 1. As shown in FIG. 5, control unit 530 can be included in a die (e.g., a controller chip) separated from dice (e.g., memory chips) 511, 512, 513, and 514. Control unit 530 can include a record keeper 545 including management information 550 and a buffer 546. Record keeper 545, management information 550, and buffer 546 can include content and operate in ways similar to, or the same as, record keeper 145, management information 150, and buffer 146, respectively, of control unit 130 of FIG. 1. Memory device 501 can be configured to operate in ways similar to, or the same as, memory device 101 of FIG. 1. Thus, control unit 530 can be configured to operate in ways similar to, or the same as, control unit 130 of FIG. 1.

Host controller 565 may include a central processing unit (CPU), which can be part of a general-purpose processor or part of an application specific integrated circuit (ASIC). Host controller 565 can correspond to host controller 165 of FIG. 1. Thus, host controller 565 can be configured to operate in ways similar to, or the same as, host controller 165 of FIG. 1.

System memory 525 may include a DRAM device, an SRAM device, a flash memory device, or a combination of these memory devices. I/O controller 551 can include a communication module for wired or wireless communication (e.g., communication through one or more antennas 558). Display 552 can include a liquid crystal display (LCD), a touchscreen (e.g., capacitive or resistive touchscreen), or another type of display. Pointing device 556 can include a mouse, a stylus, or another type of pointing device.

FIG. 5 shows the components of system 500 arranged separated from each other as an example. In some arrangements, two or more components of system 500 can be located on the same die (e.g., same chip).

Figure 6:
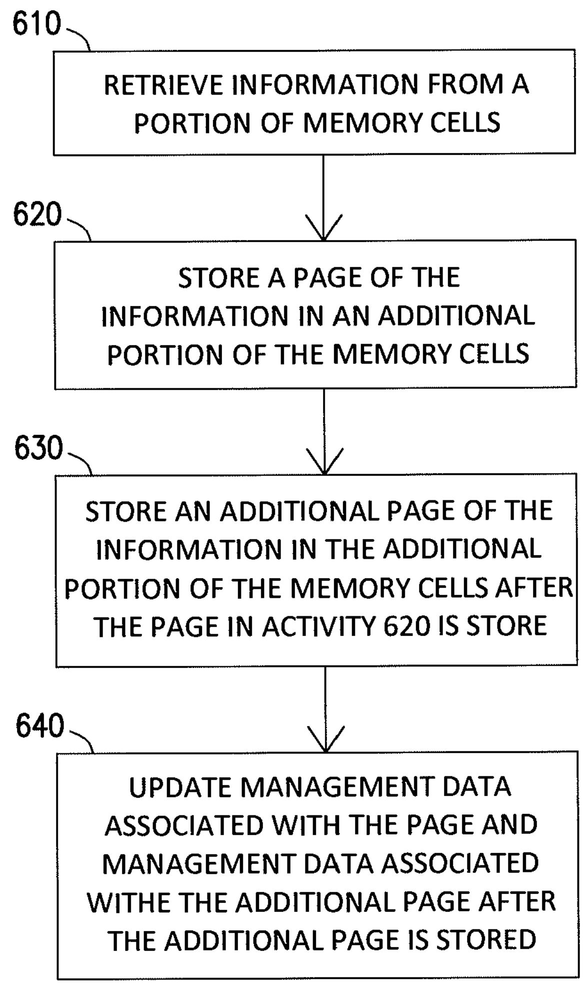
FIG. 6 is a flow diagram showing a method of managing information in a memory device, according to some embodiments described herein.

FIG. 6 is a flow diagram showing a method 600 of managing information in a memory device, according to some embodiments described herein. Method 600 can be performed by a memory device (memory device 101 or memory device 501) described above with reference to FIG. 1 through FIG. 5. Some or all of the activities in method 600 can be implemented by software, firmware, hardware, or any combination of software, firmware, and hardware.

As shown in FIG. 6, method 600 can include activities 610, 620, 630, and 640. Activity 610 can include retrieving information (e.g., information 220, 320, or 420 in FIG. 2 through FIG. 4C) from memory cells (e.g., memory cells 110 in FIG. 1) of a memory device. The information may be already stored in a portion (e.g., portion 111) of the memory cells of the memory device. The information can include a page associated with management data (e.g., metadata), and an additional page associated with additional management data (e.g., additional metadata). Activity 620 can include storing the page of the information in an additional portion of the memory cells. Activity 630 can include storing the additional page of the information in the additional portion of the memory cells after the page in activity 620 is stored in the additional portion of the memory cells in activity 620. Activity 640 can include updating the management data and the additional management data after the additional page is stored in the additional portion of the memory cells.

Activities 610, 620, 630, and 640 may be performed in the order (e.g., sequence) shown in FIG. 6.

Method 600 can include additional activities described above with reference to FIG. 1 through FIG. 5, such as activities and operations of apparatus 100 and system 500 (including operations of control units 130 and 530 and buffers 146 and 546) and other operations associated with FIG. 2 through FIG. 5.

The illustrations of the apparatuses (e.g., apparatus 100 and system 500) and methods (e.g., method 600 and operations performed by apparatus 100 and system 500) are intended to provide a general understanding of the structure of various embodiments and are not intended to provide a complete description of all the elements and features of an apparatus that might make use of the structures described herein.

The apparatuses (e.g., apparatus 100 and system 500) described above can include or be included in high-speed computers, communication and signal processing circuitry, single- or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6 include apparatuses and methods having memory cells and a control unit. The control unit can retrieve information from a portion of the memory cells. The information can include bits organized into bit groups. The information can be associated with management information. The control unit can store the bit groups in an additional portion of the memory cells. The control unit can update the management information after the bit groups are stored. Other embodiments, including additional apparatuses and methods, are described.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description.

What is claimed is:

1. An apparatus comprising:

memory cells; and a control unit to:

retrieve information from a first portion of the memory cells, the information including bits organized into a first bit group and second bit group, the information associated with management information, wherein the first bit group is included in a page of the information and the second bit group is included in another page of the information;

store the first bit group in a second portion of the memory cells;

store the second bit group in the second portion of the memory cells after the first bit group is stored; and update the management information after the second bit group is stored, wherein the bits of the information are further organized into at least one additional bit group besides the first and second bit groups, and the control unit is further configured to:

store the at least one additional bit group in the second portion of the memory cells after the second bit group is stored and before the management information is updated; and update the management information after the at east one additional group is stored.

2. The apparatus of claim 1, wherein management information includes a first link between a first logical address associated with the first bit group and a first physical address in the second portion of the memory cells, and a second link between a second logical address associated with the second bit group and a second physical address in the second portion of the memory cells.

3. The apparatus of claim 1, wherein the first portion of the memory cells is included in a first memory block and the second portion of the memory cells is included in a second memory cell block.

4. An apparatus comprising:

a first memory cell and a second memory cell; and a control unit to:

store a first bit and a second bit in the first memory cell;

retrieve the first bit and the second bit from the first memory cell;

store the first bit in the second memory cell after the first bit is retrieved from the first memory cell:

store the second bit in the second memory cell after the first bit is stored in the second memory cell;

update a first link between a first logical address and a first physical address associated with the first bit after the second bit is stored in the second memory cell; and update a second link between a second logical address and a second physical address associated with the second bit, wherein the control unit is further configured to store a third bit in the second memory cell after the second bit is stored and before the first and second links are updated, and update a third link between a third logical address and a third physical address associated with the third bit after the third bit is stored.

5. The apparatus of claim 4, wherein the control unit is further configured to:

store a fourth bit in the second memory cell after the third bit is stored and before the first and second links are updated; and update a fourth link between a fourth logical address and a fourth physical address associated with the fourth bit after the third bit is stored.

6. The apparatus of claim 4, wherein the first and second hits are included in different pages of information.

7. An apparatus comprising:

an interface to couple to a host; and memory cells included in a memory device, each of the memory cells configured to store multiple bits; and a control unit to:

retrieve information from a first group of the memory cells included in the memory device, the information including bits organized into a first bit group and second bit group, the information associated with metadata;

store the first bit group in a second group of the memory cells included in the memory device;

store the second bit group in the second group of memory cells after the first bit group is stored; and update the metadata associated with the information after the second bit group is stored, wherein the bits of the information are further organized into at least one additional bit group besides the first and second bit groups, and the control unit is further configured to:

store the at least one additional bit group in the second portion of the memory cells after the second bit group is stored and before the management information is updated; and update the management information after the at least one additional bit group is stored.

8. The apparatus of claim 7, wherein the metadata includes links between logical addresses based on logical addresses recognized by the host and physical addresses associated with the first and second groups of memory cells.

9. The apparatus of claim 8, wherein the memory cells are included in a single die.

10. The apparatus of claim 8, wherein the memory cells are included in multiple dice.

11. The apparatus of claim 7, wherein the interface, the memory cells, and the control unit are included in a solid state drive (SSD).

12. The apparatus of claim 7, wherein the interface includes a connector having a form factor complying with one of Peripheral Component Interconnect Express (PCIe) specification, Serial Advanced Technology Attachment (SATA) specification, and Serial Attached Small Computer System Interface (SAS) specification.

13. A method comprising:

retrieving information from memory cells of a memory device, the information being stored in a first portion of the memory cells and including a first page, a second page, and a third page, each of the first and second pages including a plurality of bits, the first page associated with first management data, the second page associated with second management data;

storing the first page in a second portion of the memory cells;

storing the second page in the second portion of the memory cells after the first page is stored the second portion of the memory cells;

updating the first management data and the second management data after the second page is stored the second portion of the memory cells;

storing the third page in the second portion of the memory cells after the second page is stored and before the management information is updated; and updating the management information after the third page is stored.

14. The method of claim 13, wherein the first portion of memory cells includes a first group of memory cells and a second group of memory cells, the first page is retrieved from the first group of memory cells, and the second page is retrieved from the second group of memory cells.

15. The method of claim 13, wherein the first and second pages are retrieved from same memory cells in the first portion of the memory cells.

16. The method of claim 13, wherein the first and second pages are retrieved from different memory cells in the first portion of the memory cells.

17. The method of claim 13, wherein the first and second pages are stored during a consolidation operation in the memory device.

* * * * *